(12) United States Patent
Ong et al.

(10) Patent No.: US 7,147,709 B1
(45) Date of Patent: Dec. 12, 2006

(54) NON-CONTACT ETCH ANNEALING OF STRAINED LAYERS

(75) Inventors: Philip Ong, Milpitas, CA (US); Francois Henley, Aptos, CA (US); Igor Malik, Palo Alto, CA (US)

(73) Assignee: Silicon Genesis Corporation, San Jose, CA (US)

( * ) Notice: Subject to any disclaimer, the term of this patent is extended or adjusted under 35 U.S.C. 154(b) by 582 days.

(21) Appl. No.: 10/701,723

(22) Filed: Nov. 4, 2003

Related U.S. Application Data

(63) Continuation-in-part of application No. 10/264,393, filed on Oct. 4, 2002.
(60) Provisional application No. 60/484,181, filed on Jun. 30, 2003.

(51) Int. Cl.
*H01L 21/3105* (2006.01)
(52) U.S. Cl. .................. 117/3; 117/2; 117/4; 117/7; 117/935; 117/939; 438/689; 438/704; 438/718; 438/719
(58) Field of Classification Search .................. 117/3, 117/2, 4, 7, 935, 939; 438/689, 704, 718, 438/719
See application file for complete search history.

(56) References Cited

U.S. PATENT DOCUMENTS

| 3,392,069 A | 7/1968 | Merkel et al. |
| 5,374,564 A | 12/1994 | Bruel |
| 5,793,913 A | 8/1998 | Kovacic |

(Continued)

FOREIGN PATENT DOCUMENTS

| EP | 1085562 A2 * | 3/2001 |

(Continued)

OTHER PUBLICATIONS

Hobuka H. et al.: Change in Microroughness of a Silicon Surface During inn Situ Cleaning Using HF and HCL Gases: Journal of the Electrochemical society, Electrochemical society, Manchester, new Hampshire, US, vol. 145, No. 12. Dec. 1998, pp. 4264-4271, XP00901677 ISSN: 0013-4651, the whole document.

(Continued)

*Primary Examiner*—Yogendra N. Gupta
*Assistant Examiner*—Matthew J. Song
(74) *Attorney, Agent, or Firm*—Townsend and Townsend and Crew LLP

(57) ABSTRACT

The present invention provides a method of forming a strained semiconductor layer. The method comprises growing a strained first semiconductor layer, having a graded dopant profile, on a wafer, having a first lattice constant. The dopant imparts a second lattice constant to the first semiconductor layer. The method further comprises growing a strained boxed second semiconductor layer having the second lattice constant on the first semiconductor layer and growing a sacrificial third semiconductor layer having the first lattice constant on the second semiconductor layer. The method further comprises etch annealing the third and second semiconductor layer, wherein the third semiconductor layer is removed and the second semiconductor layer is relaxed. The method may further comprises growing a fourth semiconductor layer having the second lattice constant on the second semiconductor layer, wherein the fourth semiconductor layer is relaxed, and growing a strained fifth semiconductor layer having the first semiconductor lattice constant on the fourth semiconductor layer. The method controls the surface roughness of the semiconductor layers. The method also has the unexpected benefit of reducing dislocations in the semiconductor layers.

15 Claims, 4 Drawing Sheets

U.S. PATENT DOCUMENTS

| | | | |
|---|---|---|---|
| 6,013,563 | A | 1/2000 | Henley et al. |
| 6,020,252 | A | 2/2000 | Aspar et al. |
| 6,107,653 | A * | 8/2000 | Fitzgerald .................. 257/191 |
| 6,287,941 | B1 | 9/2001 | Kang et al. ................. 438/459 |
| 6,291,321 | B1 | 9/2001 | Fitzgerald .................. 438/494 |
| 6,455,397 | B1 | 9/2002 | Belford |
| 6,503,773 | B1 | 1/2003 | Fitzgerald |
| 6,514,836 | B1 | 2/2003 | Belford |
| 6,563,152 | B1 | 5/2003 | Roberts et al. |
| 6,723,661 | B1 * | 4/2004 | Fitzergald .................. 438/763 |
| 6,809,009 | B1 | 10/2004 | Aspar et al. |
| 2001/0039095 | A1 | 11/2001 | Marty |
| 2002/0174828 | A1 | 11/2002 | Vasat et al. ................... 117/90 |
| 2003/0140844 | A1 * | 7/2003 | Maa et al. ...................... 117/4 |
| 2005/0118754 | A1 | 6/2005 | Henley et al. |

FOREIGN PATENT DOCUMENTS

| | | |
|---|---|---|
| JP | 61125012 | 6/1996 |
| WO | 00/63965 | 10/2000 |
| WO | 01/54175 | 7/2001 |

OTHER PUBLICATIONS

Patent Abstract of Japan, vol. 010, No. 313 (E-448), Oct. 24, 1986 & JP 61 125012 A (Toshiba Corp.) Jun. 12, 1986 abstract.

Onojima N. et al.: "Lattice Relaxation Process of AIN Growth on Atomically Flat 6H-SicC Substrate in Molecular Beam Expitaxy" Journal of Crystal Growth, North-Holland Publishing Co. Amsterdam, NL, vol. 237-239, Apr. 2002, pp. 1012-1016, XP004355929 ISSN: 0022-0248, p. 1013.

Hiroyuki Yaguchi et al.: Strain Relaxation in MBE Grown SI1-XGEX/SU (100) Heterostrutures by Annealing: Japanese Journal of Applied Physics, Publication Office Japanese Jouranl of Applied Physics, Tokyo, JP, vol. 30, No. 8B Part 2, Aug. 15, 1998, pp. L1450-L1453, XP0000268049 ISSN: 0021-4922 p. L1450.

Adam et al., SOI as a Mainstream IC Technology, Proceedings 1998 IEEE International SOI Conference, Oct. 1998, pp. 9-12.

Belford et al., Performance-Augmented CMOS Using Back-end Uniaxial Strain, 2002 Device Research Conference, Santa Barbara, CA.

Comita et al., Low Tempeature Si and SiGe Epitaxy for sub 01.µm Technology, AMAT Conference Paper, Mar. 10, 2003.

Chuang et al., Design Considerations of SOI Digital CMOS VLSI, Proceedings 1998 IEEE International SOI Conference, Oct. 1998, pp. 5-8.

Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.

Ge et al., Process-Strained Si (PSS) CMOS Technology Feturing 3D Strain Engineering, IEEE International Electron Devices Meeting, Washington, DC, Dec. 2003.

Mantl et al., Enhanced Strain Relaxation of Epitomical SiGe-Layers ON Si (100) Improved by Hydrogen Implantation, Nuclear Instruments and Methods in Physics Research Section B, Jan. 1999, v. 147, Issue 1-4, p. 29-34.

QE'S Smooth Approach Increases Carrier Mobilities, News, www.compoundsemiconductor.net, Dec. 2004.

Saenger, et al., Amorphization/templated recrystallization Method for Changing the Orientation of Single-Crystal Silicon: An Alternative Approach to Hybrid Orientation Substrates, Appl. Phys. Lett. 87, 221911, 2005.

Thomspson, Strained Silicon MOSFETs: The Next Material Change to Extend Moore's Law, University of Florida, Spring MRS 2004.

Yang et al., On the Integration of CMOS with Hybrid Crystal Orientations, 2004 Symposium on VLSI Technology Digest of Technical Papers, 2004.

Yang et al., High Performance CMOS Fabricated on Hybrid Substrate with Different Crystal Orientations, IEDM Tech. Dig., 2003, pp. 453-456.

* cited by examiner

NON-CONTACT ETCH ANNEALING OF STRAINED LAYERS

RELATED APPLICATIONS

This application claims the benefit of U.S. Provisional Application No. 60/484,181, filed Jun. 30, 2003, and is a continuation-in-part of U.S. application Ser. No. 10/264,393, filed Oct. 4, 2002.

FIELD OF THE INVENTION

Embodiments of the present invention relate to controlling the growth and morphology of surface roughness during an annealing and relaxation process of strained films, and more particularly to decreasing surface crystalline dislocations during a relaxation process.

BACKGROUND OF THE INVENTION

In the conventional art, many semiconductor device fabrication processes utilize planar surfaces. Furthermore, as semiconductor fabrication technology progresses, increasing carrier mobility and decreasing lattice dislocation density become increasingly critical. Improving device yields by reducing dislocations provides for improved manufacturing efficiencies and cost.

In the conventional art, a silicon layer is used as the active device medium upon which semiconductor devices are fabricated. Single-crystal silicon has a specific carrier mobility value that is fundamental to the material. The mobility value is a key parameter in many active semiconductor devices. Often, it is desired to enhance or increase the device carrier mobility value to increase the switching speed and therefore the performance of the fabricated devices such as transistors. Because of the many fundamental and specific advantages in utilizing silicon as the semiconductor material, it is highly desirable to adopt methods to enhance silicon mobility instead of utilizing higher mobility materials that are harder to process such as Germanium or Gallium Arsenide.

One practical method of enhancing silicon mobility is by straining the silicon layer. By placing the active silicon under tension, significantly higher mobility resulting in higher device switching speed and drive currents can be achieved.

A method of generating such tensile strained silicon involves growing the silicon layer epitaxially above a relaxed silicon germanium film of a specific composition. This effect occurs because the silicon lattice constant, about 5.43 Angstroms, is smaller than the lattice constant of a fully relaxed silicon germanium alloy film. Such alloys can be engineered to have a lattice spacing linearly varying from 5.43 Angstroms (100% silicon) to 5.65 Angstroms (100% germanium). For the pure germanium film, the lattice spacing is about 4% larger than pure silicon. Thus for example, a $Si_{0.75}Ge_{0.25}$ alloy (25% germanium content) would have a lattice constant about 1% larger than silicon.

The strained silicon film could therefore be advantageously fabricated by epitaxially growing the device silicon film on a relaxed silicon Germanium (SiGe) alloy film of the requisite composition.

A fundamental complication of this mobility enhancement approach is the requirement of a relaxed SiGe film. If the SiGe film is grown onto a base silicon wafer, the film will first grow in a lattice-matched manner as a compressive layer. This means that the SiGe alloy will be compressed to the natural silicon lattice spacing and will be strained. Since the function of the alloy film requires a relaxation of the compressive strain, there must be a step where the SiGe alloy is relaxed to its unstrained state. Such a step necessarily introduces numerous dislocations in the SiGe layer to accommodate the lattice spacing and volume increase. The film also usually "buckles" and roughens significantly during this relaxation process.

The major parameters characterizing a practical relaxed SiGe alloy film include the amount that the film has been relaxed from its strained state (i.e. 50% relaxation would mean that the film has relaxed half of its strain), the roughness of the film, and the dislocation defect density that would be affecting the subsequent growth of the strained silicon device film.

The surface dislocation density is a critical parameter affecting the electrical properties of semiconductor materials since they are highly dependent upon crystalline defects. Dislocations can comprise insertion of an extra half-plane of atoms into a regular crystal structure, displacement of whole rows of atoms from their regular lattice position, and/or displacement of one portion of the crystal relative to another portion of the crystal. Dislocations present on the device layer can tend to short-circuit p-n junctions and also scatter electrons in a uniform n-type crystal, impeding their motion and reducing their mobility. Dislocations also cause highly localized distortion of the crystal lattice leading to the formation of "trapping" sites where the recombination of positive (holes) and negative (electrons) carriers is enhanced. This may cause, for example, the electrons from the n-p-n transistor emitter to recombine with holes in the p-type base regions before they can be collected at the n-type collector region, reducing the transistor current gain. This electron "lifetime" may be significantly reduced by recombination when as few as one out of $10^{11}$ atoms/cm3 of silicon are removed from their normal lattice sites. Although some dislocations can be removed from a semiconductor material by thermal annealing, many dislocations are permanent and thermally stable. Many of the relaxation approaches are therefore tuned to minimize the defect density of the type that can be translated to the device layer and cause device performance degradation, failure and yield losses.

In one method according to the conventional art, the SiGe alloy is grown with a slowly varying grade from 0% germanium to the required alloy composition at a sufficiently low temperature to grow a dislocation free initial film and through subsequent annealing, the slow gradient helps to accommodate film relaxation through the generation of dislocations that are buried within the SiGe layer. This technology is explained in Legoues & al. (U.S. Pat. No. 5,659,187 "Low defect density/arbitrary lattice constant heteroepitaxial layers"). To limit the production of dislocations threading to the surface, the SiGe grade is usually less than 2% composition increase per 1000 Angstroms of SiGe film growth. This shallow gradient approach is lower in productivity due to its relatively thick SiGe layer composition and may require numerous growth/anneal cycles to achieve roughness and dislocation goals.

In yet another method according to the conventional art, the surface roughness or the SiGe alloy layer can be reduced using a chemical mechanical polishing (CMP) process such as taught by Fitzgerald (U.S. Pat. No. 6,291,321 "Controlling threading dislocation densities in Ge on Si using graded GeSi layers and planarization" and U.S. Pat. No. 6,107,653, "Controlling threading dislocation densities in Ge on Si using graded GeSi layers and planarization"). CMP utilizes a combination of vertical force between a wafer and an abrasive pad as well as a chemical action of a slurry, to polish the surface of the wafer to a highly planar state. The roughness of the resulting semiconductor surface can typically be reduced to approximately 1 Angstrom RMS when measured by an Atomic Force Microscope (AFM). However, CMP is relatively costly as a result of the slurry and the amount of time it takes to perform the process. Furthermore, the CMP process does not generally reduce the dislocation density in the wafer. Finally, this linear growth/anneal/CMP sequence is costly as it requires numerous sequential process and wafer handling steps.

Another method uses miscut wafers to help the grown film to relax as much as possible and accommodate the lattice mismatches. See for example Fitzgerald & al. (U.S. Pat. No. 6,039,803, "Utilization of miscut substrates to improve relaxed graded silicon-germanium and germanium layers on silicon") that teaches the improvement of using base wafers having 1 to about 8 degrees of miscut from a true [100] orientation to help grow a less defective, relaxed layer of a second semiconductor material. Although the base substrate miscut can improve the relaxed defect density to some extent, the improvements are generally considered insufficient for leading edge applications.

Referring to FIG. 1, a flow diagram of a process according to the conventional art is shown. This process produces a relaxed film of SiGe alloy material by first growing a strained film on a base wafer 110, subjecting the strained film to an anneal step to relax the film and concurrent generation of surface roughening (buckling) and dislocations 120, followed by a planarization smoothing step such as CMP 130. The use of an epitaxial step such as CVD (Chemical Vapor Deposition) or MBE (Molecular Beam Epitaxy) followed by a planarization step such as CMP significantly complicates the film relaxation preparation process since multiple equipment, cleans, and wafer handling are required. This in turn would increase the manufacturing cost of the relaxed film fabrication process.

Referring now to FIGS. 2A–2C, various sectional views of a semiconductor layer are shown to illustrate the anneal/CMP conventional art such as disclosed by Fitzgerald in more detail. As depicted in FIG. 2A, a single crystalline semiconductor surface formed by an epitaxial process wherein a strained SiGe film 210 is grown onto a base silicon wafer 220. The semiconductor layer is comprised of single crystalline silicon-germanium having a surface roughness 230 of approximately 1–2 Angstrom RMS. The silicon-germanium layer typically was grown at a sufficiently low temperature where the film is supercritically stressed but no relaxation has taken place. The dislocation defect density 240 is therefore very low, on the order of 1 dislocations/cm$^2$ or less.

As depicted in FIG. 2B, an anneal is performed on the substrate to relax the SiGe alloy film which generates substantial surface roughening 250 and dislocation defects 260. The resulting surface may have a buckled roughening 250 exceeding 200–300 Angstroms RMS and a dislocation defect density 260 exceeding approximately $10^7$ dislocations/cm$^2$.

As depicted in FIG. 2C, a separate CMP process generally reduces surface roughness 270 to approximately 1–5 Angstroms RMS. However, the CMP process generally does not decrease dislocations 260 in the silicon-germanium layer 310 and must be accompanied by comprehensive clean processes.

Thus, the conventional art is disadvantageous in that planarizing processes are relatively costly and time-consuming processes. The conventional art also suffers from relatively high levels of dislocations. A better and less costly approach that can fully relax strained SiGe alloy films while controlling surface roughness and dislocation defect levels is highly desirable.

SUMMARY OF THE INVENTION

A method for etch annealing a semiconductor layer is disclosed. In addition to its significant effect in controlling the roughness increases during the relaxation process, the method has the unexpected benefit of substantially reducing dislocations. The reduced dislocation density is advantageous in that carrier mobility and yield are increased.

In one embodiment, a method of forming a strained semiconductor layer is provided. The method comprises growing a strained first semiconductor layer, having a graded dopant profile, on a wafer, having a first lattice constant. The dopant imparts a second lattice constant to the first semiconductor layer. The method further comprises growing a strained boxed second semiconductor layer having the second lattice constant on the first semiconductor layer and growing a sacrificial third semiconductor layer having the first lattice constant on the second semiconductor layer. The method further comprises etch annealing the third and second semiconductor layer, wherein the third semiconductor layer is removed and the second semiconductor layer is relaxed. The method may further comprises growing a fourth semiconductor layer having the second lattice constant on the now relaxed second semiconductor layer, wherein the fourth semiconductor layer is relaxed, and growing a strained fifth semiconductor layer having the first semiconductor lattice constant on the fourth semiconductor layer. The method controls the surface roughness of the semiconductor layers. The method also has the added benefit of reducing dislocations in the semiconductor layers.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
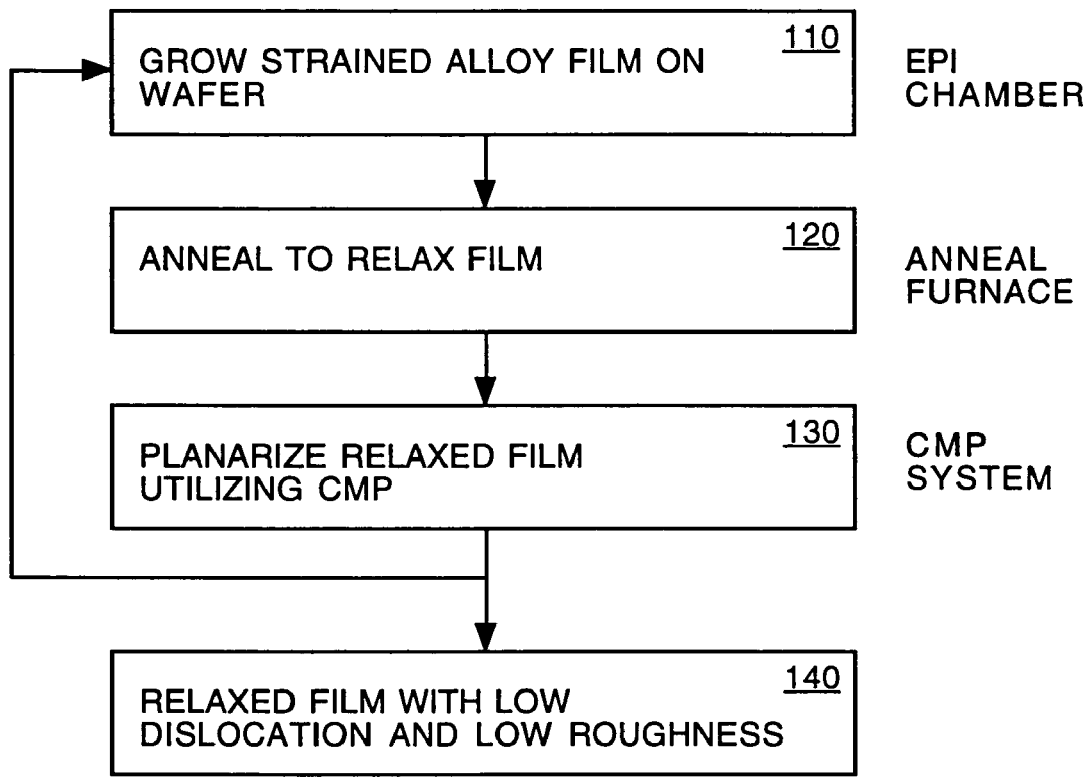
FIG. 1 shows a flow diagram of a conventional art process for controlling the surface roughness and dislocations of a semiconductor material.
Figure 2A:
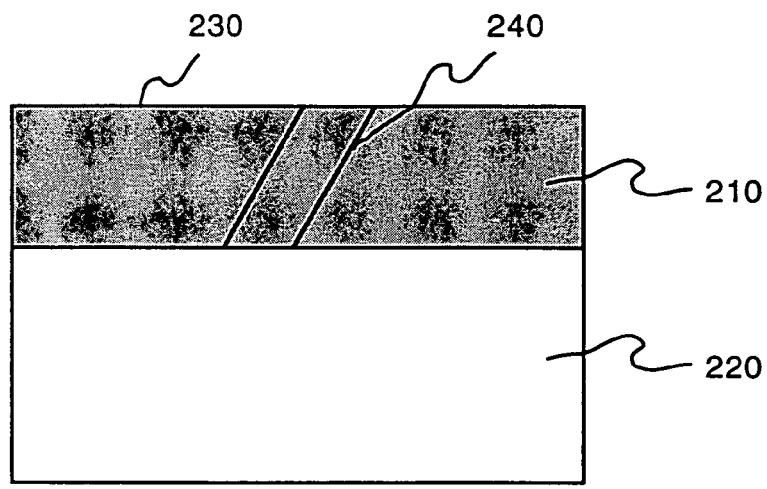
FIG. 2A shows a sectional view of a strained semiconductor layer having an initial surface roughness, according to the conventional art.
Figure 2B:
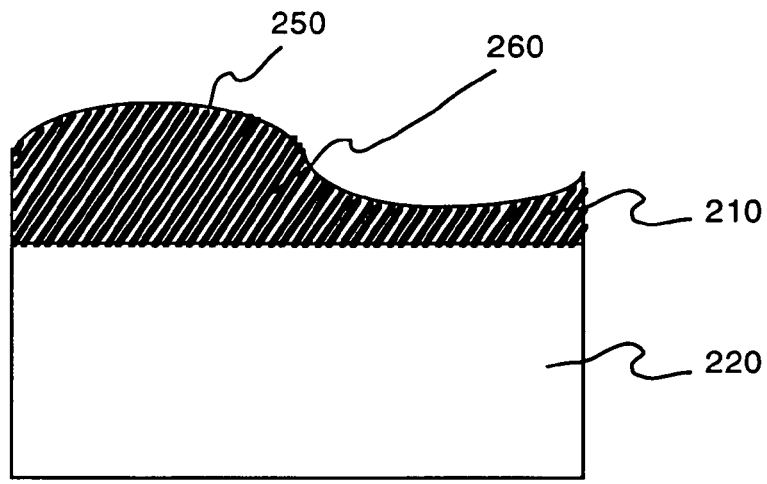
FIG. 2B shows a sectional view of a relaxed semiconductor layer having a substantially higher surface roughness and dislocation density after an annealing step, according to the conventional art.
Figure 2C:
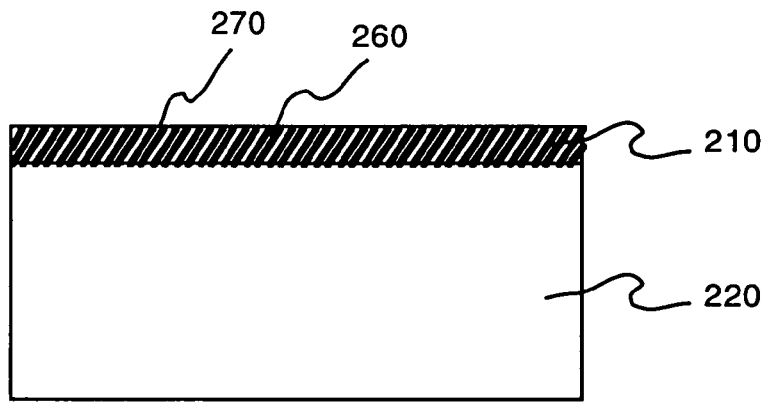
FIG. 2C shows a sectional view of a semiconductor layer having a planar surface after a CMP process is performed on the conventionally annealed surface, according to the convention art.
Figure 3:
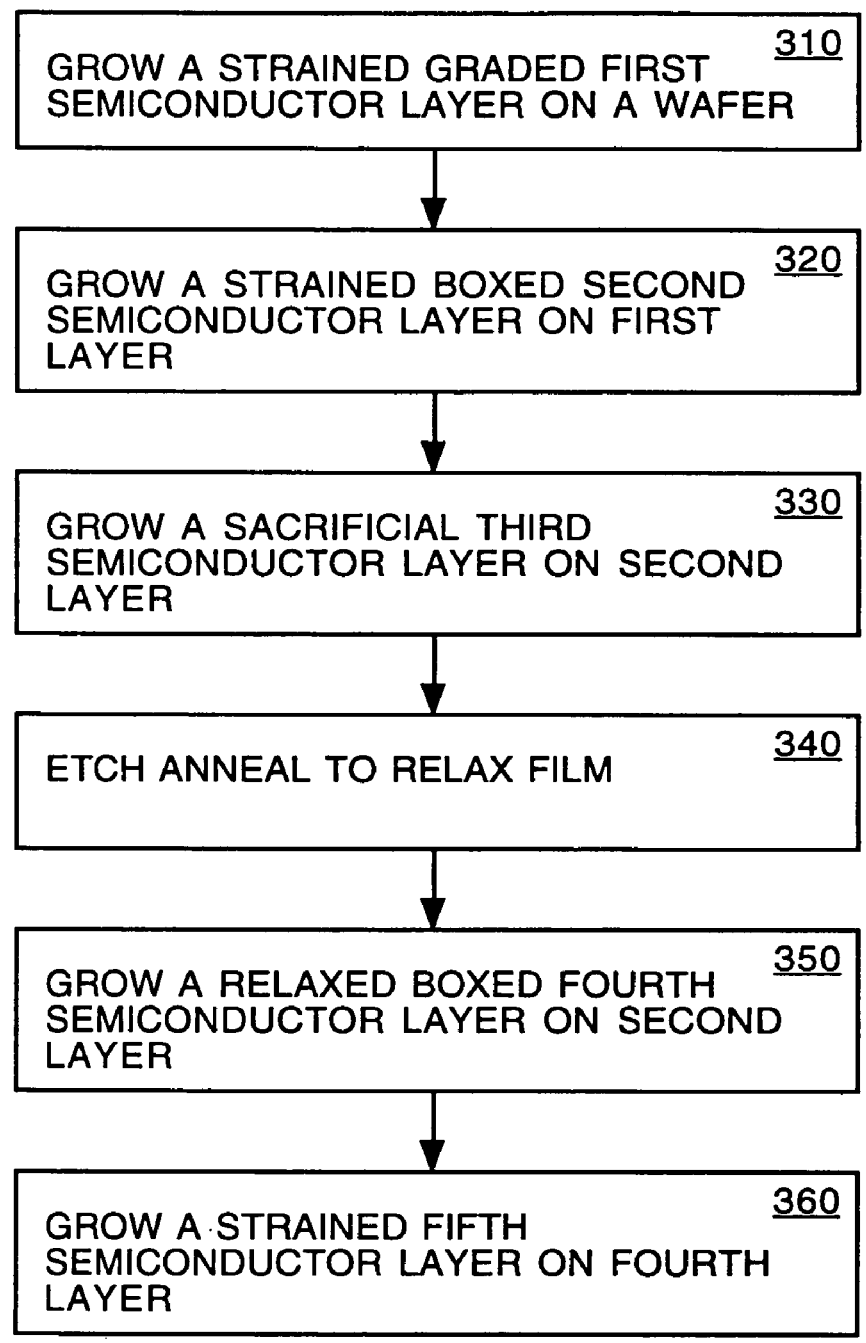
FIG. 3 shows a flow diagram of a process for controlling the surface roughness and reducing dislocations of a strained semiconductor layer, in accordance with one embodiment of the present invention.

Referring to FIG. 3, a flow diagram of a process for controlling the surface roughness and reducing dislocations of a strained semiconductor layer, in accordance with one embodiment of the present invention, is shown. As depicted in FIG. 3, the process begins with growing a strained graded first semiconductor layer, on a wafer, at 310. The wafer comprises a semiconductor having a first lattice constant. The strained graded first semiconductor layer comprises a semiconductor having a graded dopant profile, wherein the dopant imparts a second lattice constant. The first lattice constant is less than the second lattice constant. The term "lattice constant" is intended to mean the lattice structure in a normally relaxed single crystalline state.

In one implementation, the strained graded first semiconductor layer comprises a strained SiGe alloy having a graded doping profile. The stained graded SiGe layer of approximately 4000–20,000 angstroms (Å) is formed by an epitaxial deposition process. The doping profile of the germanium (Ge) increases from approximately 0% at the wafer to 25% at the surface of the strained SiGe layer. In one implementation, the epitaxial deposition process is performed in a hydrogen-chloride (HCl) ambient. The as-grown strained graded SiGe layer has a roughness of approximately 2 Angstroms root-mean-square (RMS), and less than approximately 1 dislocations/cm$^2$.

At 320, a strained boxed second semiconductor layer is grown on the strained graded first semiconductor layer. The strained boxed second semiconductor layer is grown having the second lattice constant. The term "boxed" is intended to indicate that the doping profile of the layer is substantially constant. The roughness of the strained boxed second semiconductor layer is low because the as-grown semiconductor is close to being or is fully strained and has not been subjected to thermal cycles that would have started the relaxation process. In one implementation, the strained boxed second semiconductor layer comprises a strained SiGe layer having a constant Ge doping profile. The strained boxed SiGe layer of approximately 500–5000 Å is formed by an epitaxial deposition process. The doping profile of the Ge is approximately 25% throughout the first strained boxed SiGe layer. In one implementation, the epitaxial process if performed in an HCl ambient.

At 330, a sacrificial third semiconductor layer is grown on the strained boxed second semiconductor layer. The sacrificial third semiconductor layer is grown having the first lattice constant. In one implementation, the sacrificial third semiconductor layer comprises a silicon (Si) layer. The sacrificial Si layer of approximately 100–300 Å is formed by an epitaxial deposition process. It is also appreciated that the growth of the sacrificial third semiconductor layer may be omitted.

At 340, an etch anneal is performed upon the sacrificial third semiconductor layer and the boxed second semiconductor layer. The surface is "etch annealed" utilizing, for example, an epitaxial chamber subjecting the wafer to a high temperature anneal in an etching ambient. The etch anneal etches away the sacrificial third semiconductor layer, formed at 330, and relaxes the boxed strained second semiconductor layer, formed at 320. The etch anneal may also relax the graded strained first semiconductor layer, formed at 310. This etch anneal produces a smoother surface than a simple anneal performed in a non-etching ambient.

A similar process has been shown to smooth unstrained films in a process referred to as an "epi-smoothing" process. The epi-smoothing process is disclosed in U.S. Pat. No. 6,287,941, granted Sep. 11, 2001, entitled "Surface Finishing of SOI Substrates Using an EPI Process," which is incorporated by reference herein. Since the etching process applied to relaxing strained films controls the overall roughness rather than smooths the surface, it will hereinafter called "etch annealing".

In one implementation, the etch annealing process comprises subjecting the sacrificial Si layer to an etchant including a halogen bearing compound such as HCl, HF, HI, HBr, SF$_6$, CF$_4$, NF$_3$, CCl$_2$F$_2$, or the like. The etch annealing process is performed at an elevated temperature of 700–1200° C., or greater. For example, the surface of the sacrificial Si layer and the strained boxed SiGe layer is exposed to a HCl containing gas, at an elevated temperature of 700–1200° C., in an etch annealing process, such that:

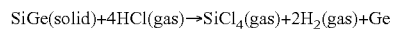

$$\text{SiGe(solid)} + 4\text{HCl(gas)} \rightarrow \text{SiCl}_4\text{(gas)} + 2\text{H}_2\text{(gas)} + \text{Ge}$$

This process is substantially the reversal of an epitaxial deposition process for growing a silicon-germanium layer. The difference being that if the concentration of hydrogen chloride is too high, the surface is etched instead of silicon-germanium being deposited. The etch annealing process removes silicon and silicon-germanium concurrently with the strain relaxation process and has been shown to help mitigate the undesirable emergence of dislocations and surface roughening. Thus, the etch annealing process acts to control surface roughening and lower dislocation density while achieving substantially complete film relaxation.

Accordingly, the etchant removes the sacrificial Si layer. Furthermore, the concurrent use of the etchant and a temperature sufficient to relax the strained boxed SiGe or the strained boxed SiGe and strained graded SiGe layers has been found to help reduce or eliminate the generation of dislocations with a concurrent reduction in relaxation roughening of the surface. This favorable effect is believed linked to a reduction of the stress inducing cycloidic cusp tips present during a non-etch anneal (H. Gao & W. D. Nix, "Surface Roughening of Heteroepitaxial Thin Films", Annu. Rev. Mater. Sci. 1999, 29, pg. 173–209). In the work by Gao and Nix, it is explained that the strain caused by the lattice mismatch drives the generation of an undulating profile on the surface that has periodic sharp cusp tips that favor the creation of dislocations at these highly stressed locations. The concurrent etching process during lattice relaxation is believed to significantly blunt or round the cusp tips that reduce the stress concentration and thus reduces the surface dislocation density by affecting its creation kinetics. The surface roughening is also disfavored by the etch ambient.

The etch annealing process may be performed at a range of elevated temperatures that would favor the concentration of the dislocations away from the surface to relax the lattice structure of the boxed SiGe layer. The thermal treatment may be from a resistance heater, RF heater, high intensity lamps, or the like. The thermal treatment means should be capable of heating the semiconductor material at a rate of approximately 10–20° C./sec, or more.

Because the strained graded SiGe layer, strained boxed SiGe layer, and the sacrificial Si layer are performed within an epitaxial reactor and the etch annealing is also performed within the same system, repetition of these steps is straightforward and the general economy of the process can be fully appreciated since no cleans, external anneals or CMP planarization steps are needed.

The etch annealing process removes strained semiconductor material in a manner that blunts sharpening (roughening) features that form on the surface upon film relaxation. The rate of etching is a function of time, temperature, and the etchant type and concentration. Therefore, controlling these parameters during the etch annealing process controls the amount of etching. The etch annealing process is performed until the process reduces surface roughness by approximately fifty percent or more compared to an anneal without the etchant. Thus, the etch annealing process acts to control surface roughening during film relaxation sufficient for subsequent semiconductor device fabrication processes. The method also provides the added benefit of reducing dislocations by up to two orders of magnitudes or more.

Furthermore, unlike convention CMP processes that are limited to removing a few tens of nano-meters or less, the etch annealing process can be used to remove as much as a few hundreds of nano-meters or more of semiconductor material.

It is also appreciated that the etch anneal may be performed partway through the growth of the strain graded first semiconductor layer formed at 310. Furthermore, the etch anneal may be performed more than once at during various processes, such as 310, 320 and/or 330.

At 350, a boxed fourth semiconductor layer is grown on the relaxed boxed second semiconductor layer. The boxed fourth semiconductor layer is grown having the second lattice constant and has a relaxed structure. In one implementation, the boxed fourth semiconductor layer comprises a relaxed SiGe layer having a constant Ge doping profile. The boxed SiGe layer of approximately 1000–10,000 Å is formed by an epitaxial deposition process. The doping profile of the Ge is approximately 25% throughout the boxed SiGe layer. In one implementation, the epitaxial process if performed in an HCl ambient.

At 360, a fifth semiconductor layer is grown on the boxed fourth semiconductor layer. The fifth semiconductor layer is grown having the first lattice constant. Accordingly, the fifth semiconductor layer is formed as a strained semiconductor layer. In one implementation, the fifth semiconductor layer comprises a silicon (Si) layer. The second Si layer of approximately 100–200 Å is formed by an epitaxial deposition process.

The fifth semiconductor layer may be utilized for fabricating additional layers thereupon or device regions therein. The reduced dislocation density of the resulting strained fifth semiconductor layer advantageously results in higher carrier mobility. The higher carrier mobility improves characteristics of devices, such as field effect transistors, bipolar transistors, and the like.

Figure 4A:
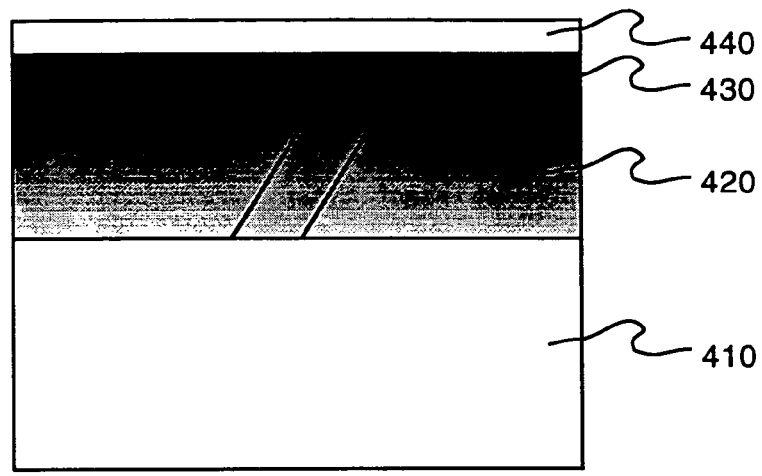
FIGS. 4A–4B show sectional views of a strained semiconductor structure having reduced surface roughness and reduced dislocations, in accordance with one embodiment of the present invention.
Figure 4B:
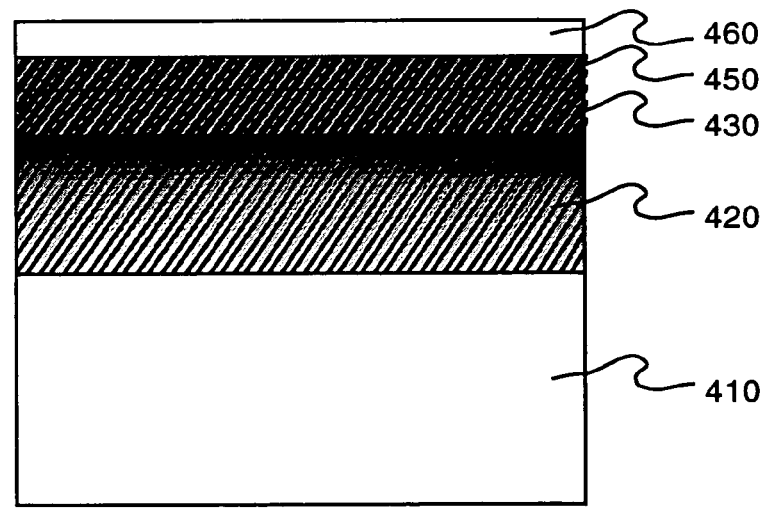

Referring now to FIGS. 4A–4B, sectional views of a strained semiconductor structure having reduced surface roughness and reduced dislocations, in accordance with one embodiment of the present invention, is shown. As depicted in FIG. 4A, an intermediate semiconductor structure comprises a wafer 410. A strained graded first semiconductor layer 420 is formed upon the wafer 410. A strained boxed second semiconductor layer 430 is formed upon the strained graded first semiconductor layer 420. A sacrificial third semiconductor layer 440 is formed upon the strained boxed second semiconductor layer 430.

As depicted in FIG. 4B, the strained semiconductor structure after an etch anneal process is shown. The graded first semiconductor layer 420 and the boxed second semiconductor layer have been relaxed by the etch anneal process. The sacrificial third semiconductor layer 440 has been removed. A boxed fourth semiconductor layer 450 is formed upon the relaxed boxed second semiconductor layer 430 and is relaxed. A fifth semiconductor layer 460 is formed upon the relaxed boxed fourth semiconductor layer 450. The fifth semiconductor layer 460 has a first lattice constant, and the relaxed boxed fourth semiconductor layer 450 has a second lattice constant. Therefore, the fifth semiconductor layer 460 comprises a strained semiconductor layer.

The etch annealing process yields a less costly alternative than the conventional art by allowing for a usable strained silicon device layer without costly external planarization steps. Furthermore, one skilled in the art would expect that etch annealing would not affect the generation of the dislocation process. However, the etch annealing process results in the unexpected benefit of decreasing the dislocation density to approximately $10^5$ dislocations/cm$^2$, as compared to an anneal made without an etch ambient of approximately $10^7$ dislocations/cm$^2$. The etch annealing process is also highly effective in fully relaxing the film, rendering it suitable as a base to grow a strained silicon device film.

The resulting strained fifth semiconductor layer 460 can be utilized for fabricating semiconductor layers thereupon or device regions therein. The reduced dislocation nature of the semiconductor layer advantageously results in higher carrier mobility. The high carrier mobility in the fifth semiconductor layer 460 improves characteristics of the devices formed therein.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming a strained semiconductor layer comprising:

a wafer having a first lattice constant growing a strained first semiconductor layer having a graded dopant profile on said wafer, wherein said dopant imparts a second lattice constant to said first semiconductor layer;

growing a strained boxed second semiconductor layer having said second lattice constant on said first semiconductor layer;

growing a sacrificial third semiconductor layer having said first lattice constant on said second semiconductor layer;

etch annealing said third and second semiconductor layer, wherein said third semiconductor layer is removed and said second semiconductor layer is relaxed;

growing a fourth semiconductor layer having said second lattice constant on said second semiconductor layer, wherein said fourth semiconductor layer is relaxed; and growing a strained fifth semiconductor layer having said first semiconductor lattice constant on said fourth semiconductor layer.

2. The method according to claim 1, wherein growing said strained first semiconductor layer comprises epitaxial deposition of graded silicon germanium.

3. The method according to claim 2, wherein said epitaxial deposition is performed in a hydrogen-chloride ambient.

4. The method according to claim 1, wherein growing said strained boxed second semiconductor layer comprises epitaxial deposition of silicon germanium.

5. The method according to claim 4, wherein said epitaxial deposition is performed in a hydrogen-chloride ambient.

6. The method according to claim 1, wherein growing said sacrificial third semiconductor layer comprises epitaxial deposition of silicon.

7. The method according to claim 1, wherein growing said fourth semiconductor layer comprises epitaxial deposition of silicon germanium.

8. The method according to claim 1, wherein growing said fifth semiconductor layer comprises epitaxial deposition of silicon.

9. A method of controlling the surface roughness of a strained semiconductor material comprising:

a wafer having a first lattice constant;

growing a strained first semiconductor layer having a graded dopant profile on said wafer, wherein said dopant imparts a second lattice constant to said first semiconductor layer;

growing a strained boxed second semiconductor layer having said second lattice constant on said first semiconductor layer;

growing a sacrificial third semiconductor layer having said first lattice constant on said second semiconductor layer; and etch annealing said third and second semiconductor layer, wherein said third semiconductor layer is removed and said second semiconductor layer is relaxed.

10. The method of claim 9, wherein etch annealing comprises exposing said third semiconductor layer to an etch ambient comprising a halogen bearing etchant.

11. The method of claim 10, wherein said halogen bearing etchant is hydrogen chloride.

12. The method of claim 10, wherein said halogen bearing etchant is hydrogen fluoride.

13. The method of claim 9, wherein etch annealing said surface of said third semiconductor layer further comprises exposing said third semiconductor layer to hydrogen.

14. The method of claim 9, wherein etch annealing said third semiconductor layer further comprises increasing a temperature of said third semiconductor layer to between 700 and 1200 degrees Celsius.

15. A method of reducing dislocations in a semiconductor material comprising:

a wafer having a first lattice constant;

growing a strained first semiconductor layer having a graded dopant profile on said wafer, wherein said dopant imparts a second lattice constant to said first semiconductor layer;

growing a strained boxed second semiconductor layer having said second lattice constant on said first semiconductor layer;

growing a sacrificial third semiconductor layer having said first lattice constant on said second semiconductor layer; and etch annealing said third and second semiconductor layer, wherein said third semiconductor layer is removed and said second semiconductor layer is relaxed.

* * * * *